(12) United States Patent
Sawamura

(10) Patent No.: US 6,495,855 B1
(45) Date of Patent: Dec. 17, 2002

(54) SEMICONDUCTOR DEVICE

(75) Inventor: Kenji Sawamura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/538,532

(22) Filed: Mar. 30, 2000

(30) Foreign Application Priority Data

Apr. 2, 1999 (JP) .......................................... 11-096413
Mar. 24, 2000 (JP) ...................................... 2000-083121

(51) Int. Cl.$^7$ ............................................ H01L 23/58
(52) U.S. Cl. ........................... 257/48; 257/510; 438/11; 438/14; 438/18
(58) Field of Search ..................... 257/48, 510; 438/11, 438/14, 18

(56) References Cited

U.S. PATENT DOCUMENTS

| | | | | | |
|---|---|---|---|---|---|
| 5,597,668 A | * | 1/1997 | Nowak et al. | ................. | 430/5 |
| 5,663,588 A | * | 9/1997 | Suzuki et al. | ............... | 257/350 |
| 5,766,803 A | * | 6/1998 | Michael et al. | ................ | 430/5 |
| 5,798,298 A | * | 8/1998 | Yang et al. | ................. | 438/622 |
| 5,900,349 A | * | 5/1999 | Han | ........................... | 430/311 |
| 5,902,752 A | * | 5/1999 | Sun et al. | .................... | 437/195 |
| 5,923,969 A | * | 7/1999 | Oyamatsu | ................... | 438/183 |
| 5,960,300 A | * | 9/1999 | Yabu et al. | ................. | 438/436 |
| 5,970,238 A | * | 10/1999 | Shibata et al. | ......... | 395/500.09 |
| 6,022,644 A | * | 2/2000 | Lin et al. | ....................... | 430/5 |
| 6,025,268 A | * | 2/2000 | Shen | ......................... | 438/669 |
| 6,037,671 A | * | 3/2000 | Kepler et al. | ............... | 257/797 |
| 6,069,067 A | * | 5/2000 | Kinugawa | ................... | 438/622 |
| 6,074,938 A | * | 6/2000 | Asamura | .................... | 438/533 |
| 6,080,615 A | * | 6/2000 | Lee et al. | .................... | 438/239 |
| 6,081,272 A | * | 6/2000 | Morimoto et al. | .......... | 345/420 |
| 6,197,452 B1 | * | 3/2001 | Matumoto | ..................... | 430/5 |

FOREIGN PATENT DOCUMENTS

JP          01239873       *  9/1989
JP          09311432       * 12/1997

* cited by examiner

Primary Examiner—Eddie Lee
Assistant Examiner—Eugene Lee
(74) Attorney, Agent, or Firm—Wenderoth, Lind Ponack, L.L.P.

(57) ABSTRACT

A dummy active region is formed in which abrading processes are averaged. A semiconductor device is characterized in that an active region for forming an actual device, a device separation region being formed by a trench, and a dummy active region formed substantially in a rectangular shape are included, and the length of the short side of the dummy active region is less than 1 μm.

12 Claims, 5 Drawing Sheets

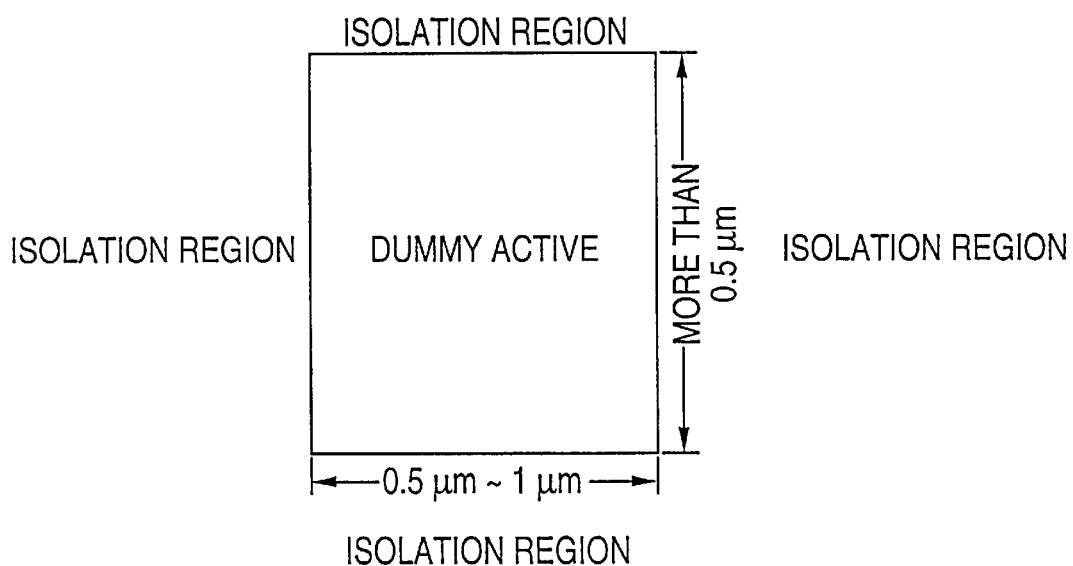
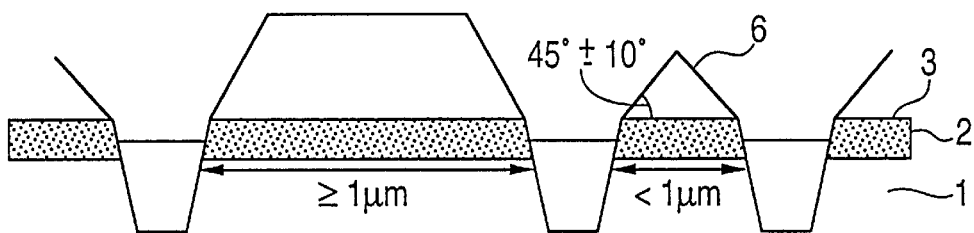

SEMICONDUCTOR DEVICE

BACKGROUND OF THE INVENTION

1. Field of the Invention

The technology of device isolation has been treated with courteous attention as the technology for forming a device isolation region in a semiconductor device. In general, an oxide film embedded in a trench is abraded by Chemical Mechanical Polishing (CMP), in accordance with the device isolation by the trench. In an abrading process, the speed of abrading the embedded oxide film is different in accordance with the trench pattern thereof. In order to average the total abrading speed in the abrading process, a suitably even dummy active pattern is formed in the region in which an ordinary active region is not formed.

2. Description of the Related Art

However, in accordance with a conventional dummy active pattern, it has been insufficient to average CMP abrasion because of micronizing during the present time.

SUMMARY OF THE INVENTION

In order to solve the above-described problem, a semiconductor device of the present invention is characterized in that an active region for forming a device, in fact, a device separation region formed by a trench, and a dummy active region formed substantially in a rectangular shape are included, and the length of the short side of a dummy active region is less than 1 μm.

BRIEF DESCRIPTION OF THE DRAWINGS

The present invention will be understood more fully understood from the detailed given below, in conjunction with the accompanying drawings in which:

FIG. 2 is a top plane view showing the first preferred embodiment of the present invention;

FIG. 3 shows a deposit condition of the oxide film of the present invention;

DETAILED DESCRIPTION OF THE INVENTION (Embodiment 1)

FIGS. 1A to 1F show a process of a semiconductor device of the first preferred embodiment of the present invention. In the following, the first embodiment is explained using FIGS. 1A to 1F. FIGS. 1A to 1F show sectional views of a dummy active region respectively. In an essential active region, the width of a device isolation region is formed according to a device pattern.

Figure 1A:
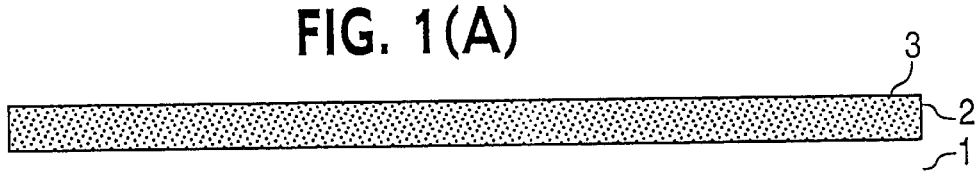
FIGS. 1A to 1F are process drawings showing the first preferred embodiment of the present invention.

A PAD oxide film 2 having a width of more or less 2000 Å is formed. Then, a silicon nitride film (SiN film) 3 having the width of more or less 500 Å to 5000 Å is formed using CVD method in the same way (FIG. 1A).

Figure 1B:
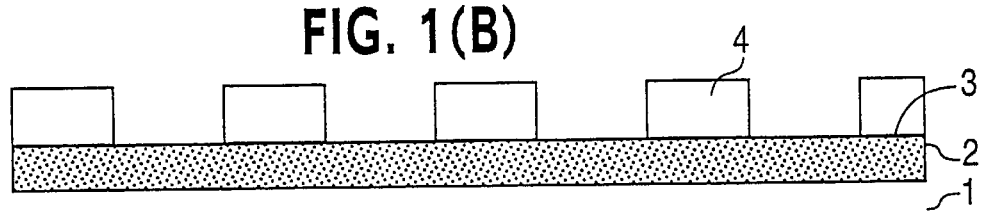

A resist is deposited on the whole surface, and patterning of a resist 4 is processed using a mask having a pattern of a trench (FIG. 1B).

The SiN film 3 and the PAD oxide film 2 are removed by plasma etching using the resist 4 as the mask. A plurality of openings are formed in the nitride film and the oxide film, in the portion in which a plurality of the trenches are formed. Then, a silicon substrate 1 is etched and a plurality of trench portions 5 are formed.

The depth formed at this time is 2500 Å to 5000 Å. A taper angle of more or less 70 to 90 degrees is formed near on the substrate of the trench. This trench portion 5 is formed in such a way that the width of the opening of the trench is wider than the width of the bottom of the trench. The taper angle is provided in the trench portion 5, in order for the oxide film to be sufficiently embedded until the bottom of the trench, in a successive oxide film embedding process.

Figure 1C:
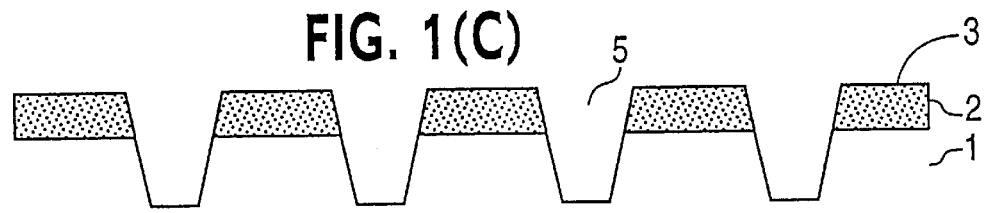

In a region where a dummy active region is formed, the trench is formed in accordance with the size of the dummy active region. In accordance with the present invention, each width of the trenches is 0.5 to 10 μm in the opening, and each of the trenches are formed successively, each distance of which is 0.5 to 1 μm (FIG. 1C).

Figure 1D:
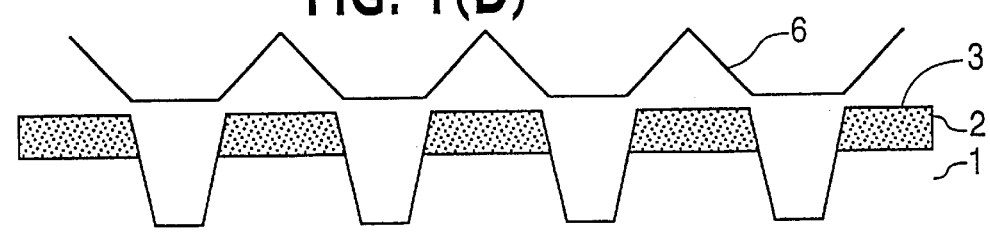

Then, an embedded oxide film 6 is formed on the whole wafer surface. In accordance with this process, the trench portion 5 is embedded in the embedded oxide film 6. This oxide film is formed by an HDP (High Density Plasma)-CVD method. This is the film forming technology using the CVD method, by supplying a high density of plasma, and a good quality oxide film can be obtained (FIG. 1D).

Figure 1E:
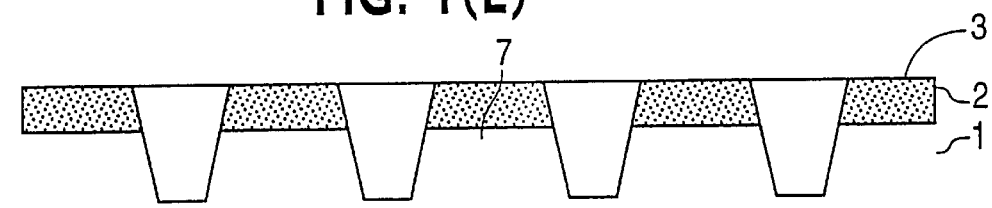

The embedded oxide film 6 deposited on the trench is abraded by Chemical Mechanical Polishing (CMP), until the height thereof becomes the same height as the surface of the SiN film 3 (FIG. 1E).

Figure 1F:
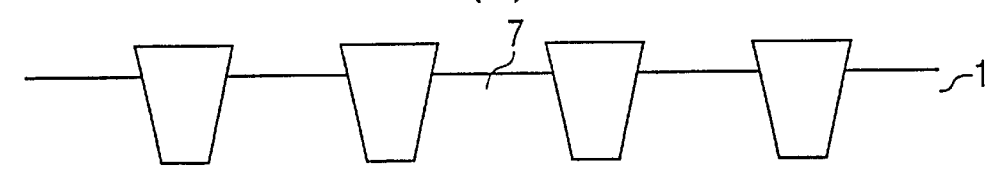

Then, the SiN film 3 and the PAD oxide film 2 are removed (FIG. 1F).

At this stage, the region enclosed by trench isolation is a dummy active region 7 of the present invention. In accordance with the present invention, the dummy active regions 7 are formed based on the condition explained in detail in the following description.

In accordance with the present preferred embodiment, the shape of the dummy active region is a rectangle. The length of a short side of the rectangle is more than 0.5 μm and less than 1 μm. The length of a long side of the rectangle is at least more than 0.5 μm. FIG. 2 illustrates a top plane view thereof. The basis for the dummy active region pattern of the present invention, in which the side length is more than 0.5 μm and the length of the short side is less than 1 μm, is explained in the following description.

First, it is supposed that each side length of the dummy active region is less than 0.5 μm. When a posi-type resist used in micro processing in general is considered, the portion in which the resist is exposed is removed by ashing, in a light exposure and development process. In order to form the shape of the dummy active region less than 0.5 μm, each width of survivor resists in a patterning process (referring to FIG. 1B) of the resists is also less than 0.5 μm. when the exposure process is performed to resists other than a necessary portion, using a microscopic pattern each side of which is less than 0.5 μm, the resists might be exposed at times which are unexpected, by a phenomenon such as light diffraction. When this kind of light diffraction occurs, the whole pattern, each side of which is less than 0.5 μm, might disappear. When the whole resist is exposed, the desired dummy active region might have not been formed.

In order to avoid the dummy active region pattern disappearing when exposed by this kind of light diffraction, it is necessary that the minimum side length of the dummy active region pattern is defined.

In accordance with experiments by inventors of the present invention, it is necessary that one side of the dummy active region pattern is more than at least 0.5 μm.

Next, it is supposed that the short side of the dummy active region to be formed is more than 1 µm. In the preferred embodiment, the oxide film embedded in the trench is the oxidation film embedded by an HDP-CVD method as described before. When the oxide film is formed by the HDP-CVD method, the sectional pattern thereof changes, corresponding to a basic pattern. This pattern is shown in detail in FIG. 3. FIG. 3 is a sectional view of the oxide film formed by the HDP-CVD method. It has been known that the oxide film has tended to be deposited with a predetermined angle to the surface of the dummy active substrate. In general, this angle is in the range of 45°±10° to the surface of the substrate as shown in FIG. 3. When the length of the short side of the dummy active region is more than 1 µm, a flat surface is formed on the top portion, the width of which is more or less 1 µm, as shown in FIG. 3.

In this way, the HDP oxide film becomes easy to deposit if the flat surface is formed on the top portion. On the other hand, as shown in FIG. 3, a vertex is made in the sectional shape of the oxide film if the width of the dummy active region is less than 1 µm. If the vertex is made in the sectional shape of the oxide film, the oxide film becomes difficult to deposit over the vertex. As a result, a different film thickness of the oxide film, based on the shape of the dummy active region appears. If a different film thickness of the oxide film appears, it becomes extremely difficult to make uniform in a successive CMP process.

Further, if there is a vertex, the pressure of CMP abrasion is concentrated on the vertex. On the other hand, if the vertex on the oxide film has the shape of a flat surface, the pressure thereof disperses. As a result, the portion having the shape of the vertex is abraded with great speed. In other words, a different abrasion speed occurs, based on the shape of the vertex of the oxide film. Thus, it is necessary for the shape of the vertex to be the same in order to abrade the oxide film uniformly. In accordance with the detailed experiments by the inventors of the present invention, if the short side of the dummy active region is less than 1 µm, an oxide film having the vertex in the sectional shape can be formed. Thus, by forming at least the length of the short side to be less than 1 µm, an oxide film having uniform thickness can be obtained, the shape of the vertex of the oxide film becomes stable, and thus stable CMP abrasion becomes possible.

In this manner, as shown in detail, the shape of the dummy active region is defined as a rectangle in such a way that the length of the side is more than 0.5 µm and the length of the short side is less than 1 µm. This shape makes it possible to average the speed of CMP abrasion.

Here, the present invention is to form the shape of the dummy active region. The width of the active region in which a device is formed may be more than 1 µm. If the abrasion speed of the oxide film on the dummy active region is slower than the abrasion speed of the oxide film on the active region in which the device is formed, a negative influence is caused in the device-forming region. However, if the abrasion speed of the oxide film on the dummy active region is not slower than the abrasion speed of the oxide film on the active region in which the device is formed, there is no problem for the most part.

(Embodiment 2)

Figure 4:
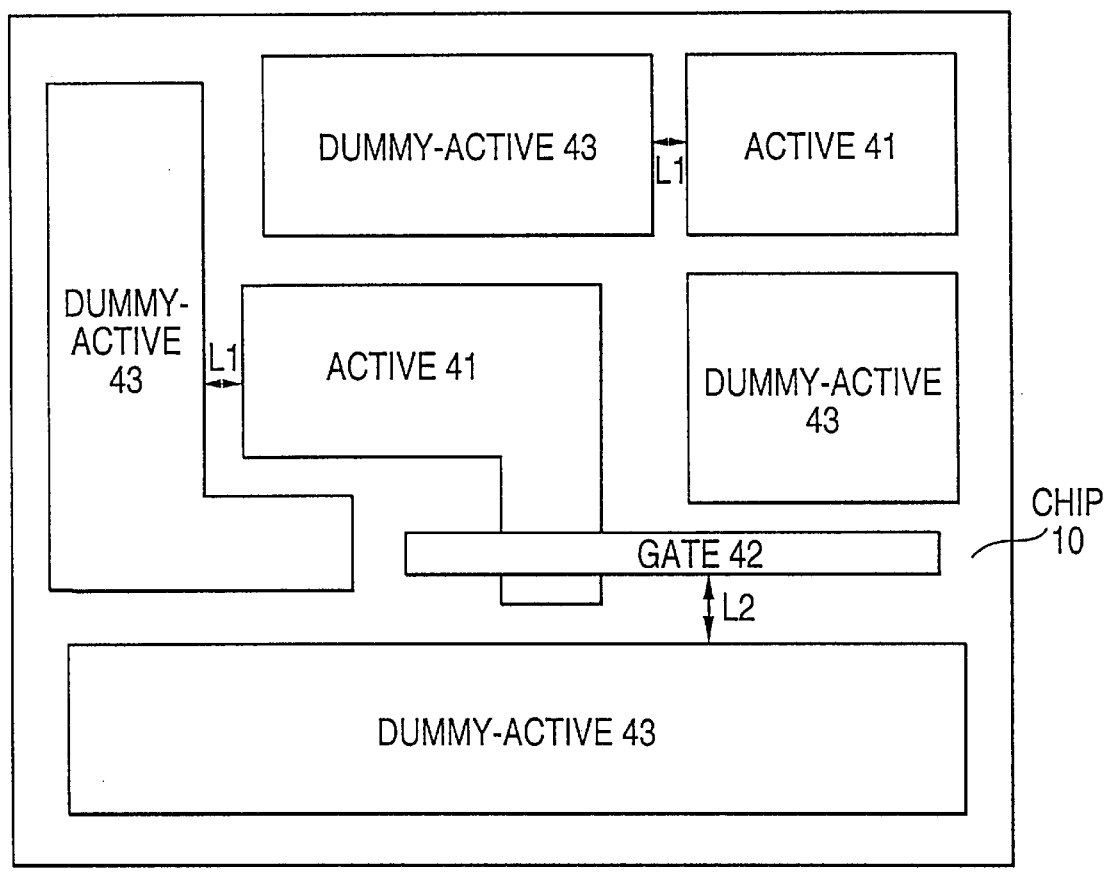
FIG. 4 shows the second preferred embodiment of the present invention.

FIG. 4 shows an example of the second preferred embodiment. FIG. 4 also shows an example for arranging the dummy active pattern on a chip, etc.

A region 41 for forming an original device, a gate electrode 42 of the first layer across the active region, a dummy active region 43, and so forth are formed on an actual chip 40.

If the dummy active region 43 exists under the gate electrode 42, parasite capacity is added to a gate electrode. In particular, if the dummy active region 43 is formed under the gate electrode 42 of the first layer (the layer closest to the substrate), it causes the speed of a transistor to decrease. In order to avoid this phenomenon, the preferred embodiment arranges regions in order not to form the dummy active region 43 under the gate electrode 42 of the first layer.

When the dummy active pattern is formed in the close vicinity of the active region 41, the active region 41 and the dummy active region 43 might cause a short circuit electrically, because of involving particles, etc. in a fabrication process.

In accordance with detailed experiments by the inventors of the present invention, in order to reduce the above described parasite capacity, a defective phenomenon caused by particles, etc., the distance (L1 in FIG. 4) between the dummy active region 43 and the active region 41, and the distance (L2 in FIG. 4) between the dummy active region 43 and the active region 41 are required to be more than 0.5 µm respectively.

This is required because the above-described short circuit problem, which could occur by only one particle if the above-described distance becomes smaller than 0.5 µm, becomes a high possibility since the size of particles in a fabricating factory is smaller than 0.5 µm for the most part.

On the other hand, if the distance from the actual active region becomes more than several tens µm, the trench having the side length more than several tens µm should be formed. When a large sized trench is formed, the phenomenon called "dishing", in which only the oxide film within the wide trench is abraded rapidly by CMP, is caused. When dishing occurs, only the film thickness of the wide trench portion becomes thin, and thus the degree of evenness and so forth are affected.

Figure 5:
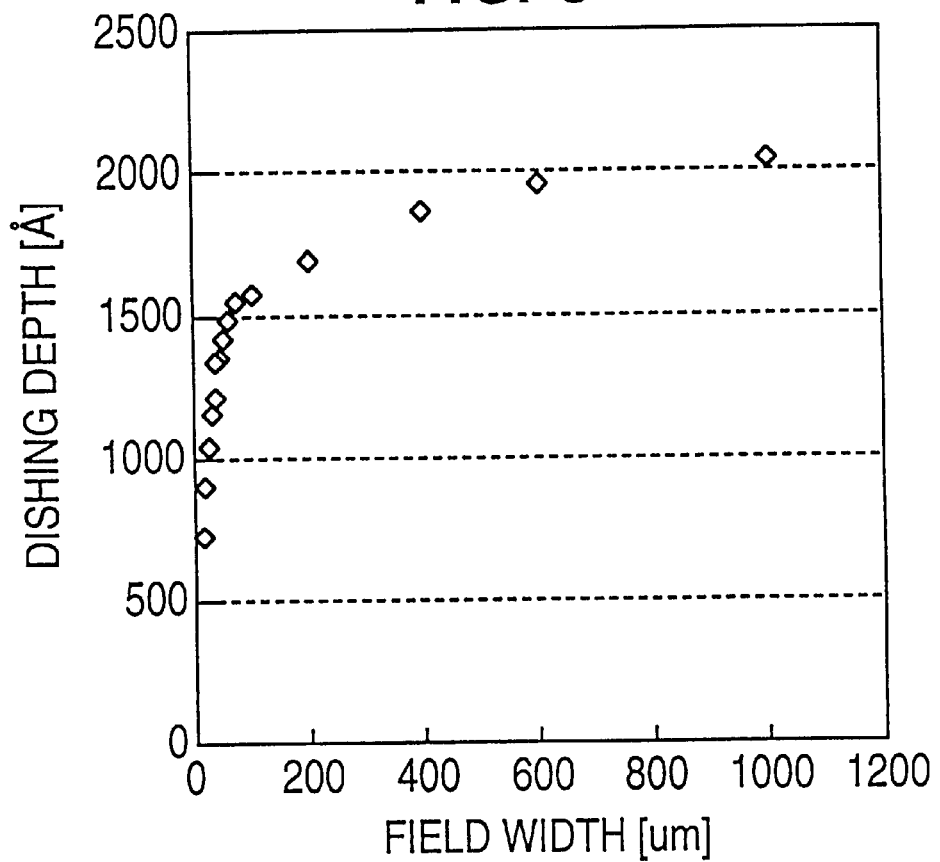
FIG. 5 shows a relationship between trench width and dishing depth.

FIG. 5 illustrates the above-described phenomenon, in which the formed depth of the trench is defined as 4000 Å, and also illustrates dishing progress when the width of the trench is changed.

As shown in FIG. 5, within the field width of 100 µm, the dishing depth increases radically even though the field width of the trench increases slightly.

The degree of scatter of abrasion by the CMP abrasion is more or less 500 Å in general, and the degree of scatter of the oxide film removing thickness is more or less 300 Å when the PAD oxidation film is removed, although it depends on the CMP device, processing time, and so forth. Namely, if the dishing depth is defined as 800 Å as a maximum, the embedded oxide film can be left in a higher portion than the surface of the semiconductor substrate, even in the portion in which the oxidation film is abraded severely, corresponding to the degree of scatter. Thus, by means of defining the distance between the active regions as to be less than 10 µm, it is possible to avoid the situation that the embedding oxide film becomes lower than the surface of the semiconductor substrate because of deep dishing depth.

Figure 6:
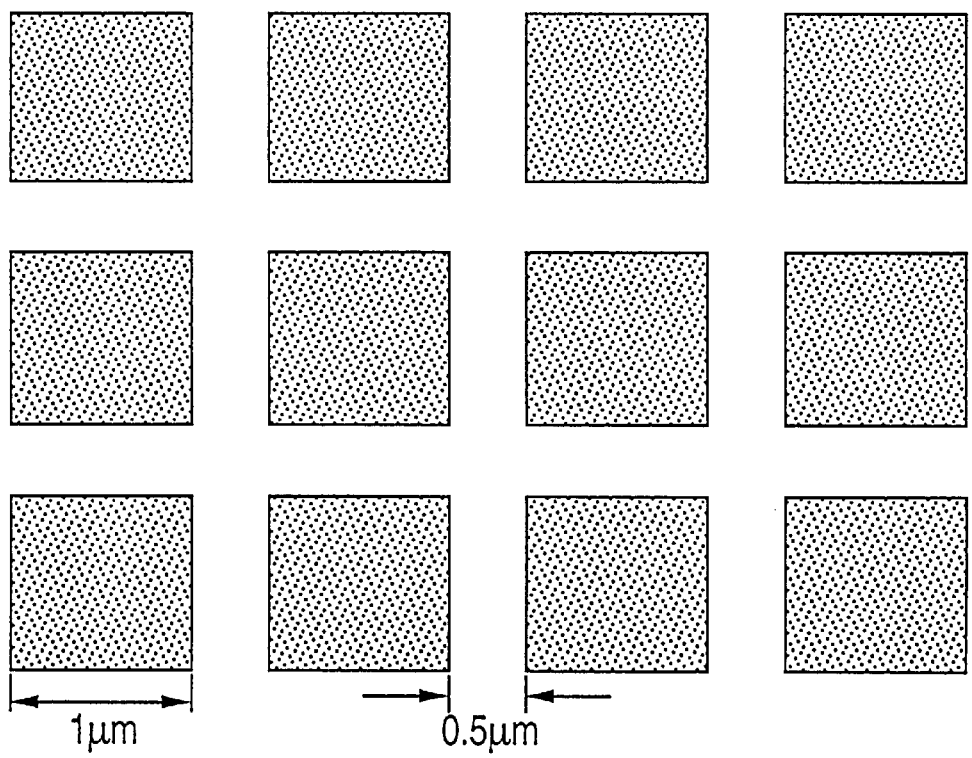
FIG. 6 shows an arrangement of dummy active regions of the present invention.

FIG. 6 is a top plane view seen from the upward direction, of the preferred embodiment of the dummy active region arranged based on the above-described condition. The region shown using oblique lines in the drawing is the active region, and the other region is the device isolation region made by the trench.

In accordance with this example, the dummy active region having the square shape, each side length of which is 1 µm is formed, shown using oblique lines which has enough size to avoid the above-described problem when exposed, and enough width to avoid the problem when the oxide film is abraded. At this stage, the width of the trench is 0.5 µm. By this arrangement, since the shape of the dummy active region is capable of being formed as the shape of a square, the degree of freedom increases when the dummy active regions are arranged, and thus is becomes possible to arrange the necessary portions adequately. Further, by this arrangement, the density of the active region is (1*1)/(1.5*1.5) and more or less 44%. Since the actual active density of a memory cell, etc. used in DRAM is more or less 40 to 50%, it is preferable indeed for a dummy pattern as shown in FIG. 6 to be used in the vicinity thereof.

Here, although the square type dummy pattern is explained as the actual example, if the dummy active pattern such as a line pattern, for example, is formed based on the above-described condition, it is possible to obtain the effect of the present invention.

In accordance with the present invention as explained in the foregoing description in detail, it becomes possible to form the dummy active region in which the abrading process is uniform and parasite capacity is not contained in gate wiring, etc.

What is claimed is:

1. A semiconductor device formed on a semiconductor substrate, said semiconductor device comprising:

an active region formed on the semiconductor substrate operable to form a semiconductor element;

a dummy active region formed on the semiconductor substrate in a rectangular shape, wherein a length of a short side of said dummy active region is substantially no greater than 1 µm and more than 0.5 µm; and an isolation region formed on the semiconductor substrate including a trench filled with a high density plasma chemical vapor deposition layer, said isolation region surrounding said active region and said dummy active region.

2. A semiconductor device as claimed in claim 1, wherein a depth of the trench is about 2500 Å to 5000 Å.

3. A semiconductor device as claimed in claim 1, wherein the trench has a tapered shape.

4. A semiconductor device as claimed in claim 3, wherein a taper angle of the trench is about 70 to 90 degrees.

5. A semiconductor device as claimed in claim 3, wherein a width of an opening of the trench is wider than a width of a bottom of the trench.

6. A semiconductor device formed on a semiconductor substrate, said semiconductor device comprising:

an active region formed on the semiconductor substrate;

a dummy active region formed on the semiconductor substrate, wherein a distance between said active region and said dummy active region is more than 0.5 µm and less than 10 µm;

an isolation region formed on the semiconductor substrate surrounding said active region and said dummy active region; and a semiconductor element formed on said active region, said semiconductor element including a gate electrode formed over said active region, wherein a distance between said dummy active region and the gate electrode is more than 0.5 µm.

7. A semiconductor device as claimed in claim 6, wherein said isolation region includes a trench filled with a high density plasma chemical vapor deposition layer.

8. A semiconductor device as claimed in claim 7, wherein said dummy active region has a rectangular shape including a short side being substantially no greater than 1 µm and more than 0.5 µm.

9. A semiconductor device as claimed in claim 8, wherein a depth of the trench is about 2500 Å to 5000 Å.

10. A semiconductor device as claimed in claim 8, wherein the trench has a tapered shape.

11. A semiconductor device as claimed in claim 8, wherein a taper angle of the trench is about 70 to 90 degrees.

12. A semiconductor device as claimed in claim 10, wherein a width of an opening of the trench is wider than a width of a bottom of the trench.

* * * * *